(12) United States Patent
Ai et al.

(10) Patent No.: US 12,328,861 B2
(45) Date of Patent: Jun. 10, 2025

(54) SEMICONDUCTOR DEVICE, MANUFACTURING METHOD THEREFOR, AND ELECTRONIC EQUIPMENT

(71) Applicant: BEIJING SUPERSTRING ACADEMY OF MEMORY TECHNOLOGY, Beijing (CN)

(72) Inventors: Xuezheng Ai, Beijing (CN); Xiangsheng Wang, Beijing (CN); Guilei Wang, Beijing (CN); Chao Zhao, Beijing (CN); Wenhua Gui, Beijing (CN)

(73) Assignee: BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 0 days.

(21) Appl. No.: 18/754,367

(22) Filed: Jun. 26, 2024

(65) Prior Publication Data
US 2025/0071968 A1    Feb. 27, 2025

Related U.S. Application Data

(63) Continuation of application No. PCT/CN2024/083352, filed on Mar. 22, 2024.

(30) Foreign Application Priority Data

Aug. 23, 2023    (CN) .................... 202311065772.9

(51) Int. Cl.
*H10B 12/00* (2023.01)
*H01L 23/522* (2006.01)
*H01L 23/528* (2006.01)

(52) U.S. Cl.
CPC ......... *H10B 12/05* (2023.02); *H01L 23/5226* (2013.01); *H01L 23/5283* (2013.01); *H10B 12/482* (2023.02); *H10B 12/488* (2023.02)

(58) Field of Classification Search
CPC . H01L 23/5226; H01L 23/5283; H10B 12/05; H10B 12/482; H10B 12/488
See application file for complete search history.

(56) References Cited

U.S. PATENT DOCUMENTS

| | | | |
|---|---|---|---|
| 11,844,206 B2 * | 12/2023 | Kim | ............. H10D 1/714 |
| 2013/0100741 A1 | 4/2013 | Choi et al. | |

(Continued)

FOREIGN PATENT DOCUMENTS

| | | |
|---|---|---|
| CN | 103066076 A | 4/2013 |
| CN | 105304638 A | 2/2016 |

(Continued)

OTHER PUBLICATIONS

CNIPA First Office Action in CN Application No. 202311065772.9 dated Sep. 21, 2023 (13 pages, including English translation).

*Primary Examiner* — Michelle Mandala
*Assistant Examiner* — Kevin Quinto
(74) *Attorney, Agent, or Firm* — BROOKS KUSHMAN P.C.

(57) ABSTRACT

A semiconductor device, manufacturing method therefor, and electronic equipment are provided. The manufacturing method includes: alternately depositing sacrificial layers and insulation layers to obtain a stacked structure; forming in the stacked structure a plurality of via holes distributed at intervals, and forming dummy word lines in the via holes; forming a first trench penetrating through the stacked structure every two via holes apart; forming a plurality of grooves by re-etching the plurality of insulation layers within the first trench, wherein two grooves of each insulation layer in two first trenches respectively expose partial side walls of a dummy word line; forming conductive layers within the two grooves corresponding to each insulation layer, wherein a conductive layer within each groove surrounds two exposed dummy word lines; and disconnecting a conductive layer (Continued)

surrounding a dummy word line to form a first electrode and a second electrode of a transistor.

15 Claims, 10 Drawing Sheets

(56) References Cited

U.S. PATENT DOCUMENTS

2022/0122977 A1   4/2022  Kim
2022/0320141 A1  10/2022  Lin et al.

FOREIGN PATENT DOCUMENTS

| | | |
|---|---|---|
| CN | 114023703 A | 2/2022 |
| CN | 114141772 A | 3/2022 |
| CN | 114373760 A | 4/2022 |
| CN | 114792693 A | 7/2022 |
| CN | 116782644 A | 9/2023 |
| KR | 101551578 B1 | 9/2015 |

\* cited by examiner

SEMICONDUCTOR DEVICE, MANUFACTURING METHOD THEREFOR, AND ELECTRONIC EQUIPMENT

CROSS-REFERENCE TO RELATED APPLICATIONS

This application is a continuation of International PCT Application. No. PCT/CN2024/083352 filed on Mar. 22, 2024, which claims priority to Chinese Patent Application No. 202311065772.9 filed on Aug. 23, 2023, the disclosures of which are hereby incorporated herein by reference in their entireties.

TECHNICAL FIELD

Embodiments of the present application relate to the field of semiconductor technologies, and in particular to a semiconductor device, a manufacturing method therefor, and an electronic equipment.

BACKGROUND

With the development of integrated circuit technology, the key dimensions of devices are shrinking day by day, and the types and quantities of devices contained in a single chip are increasing, so that any slight differences in process production may affect the performance of devices.

In order to reduce the cost of products as much as possible, people want to make as many device cells as possible on a limited substrate. Since Moore's Law came out, the industry has proposed various semiconductor structure designs and process optimizations to meet people's demands for current products.

SUMMARY

The following is a summary of the subject matters described in detail in this document. This summary is not intended to limit the scope of protection of the present application.

An embodiment of the present application provides a manufacturing method for a semiconductor device including memory cells of different layers stacked and distributed in a direction perpendicular to a substrate, each memory cell including a transistor; the manufacturing method including: sequentially and alternately depositing a plurality of sacrificial layers and a plurality of insulation layers on the substrate to obtain a stacked structure; forming in the stacked structure a plurality of via holes penetrating through the stacked structure and distributed at intervals in a first direction, and forming dummy word lines in the via holes; forming a first trench penetrating through the stacked structure every two via holes apart in the stacked structure, wherein the first trench extends in a second direction, and the plurality of insulation layers and the plurality of sacrificial layers alternately stacked are distributed between any two adjacent first trenches; forming a plurality of grooves by re-etching the plurality of insulation layers within the first trench, wherein two grooves of each insulation layer in two first trenches respectively expose partial side walls of a dummy word line; forming conductive layers within corresponding two grooves of each insulation layer, wherein a plurality of conductive layers corresponding to different insulation layers are insulated from each other, and a conductive layer in each groove surrounds an exposed dummy word line; and disconnecting the conductive layer surrounding the dummy word line in each groove in the second direction, wherein disconnected two parts are located at opposite sides of the dummy word line and the disconnected two parts are used for forming a first electrode and a second electrode of the transistor.

In some embodiments, the manufacturing method further includes forming a second trench extending in the first direction in the stacked structure.

The stacked structure includes a plurality of bit line regions and a plurality of memory cell regions connected with each of the bit line regions; a bit line region extending in the first direction is included between the second trench and each first trench; and a memory cell region is included between every two adjacent first trenches.

The bit line region and the insulation layers and the conductive layers of the memory cell regions are integrated structures respectively.

The via holes are located in an area of the memory cell regions close to the bit line region.

In some embodiments, the first trenches and the second trench are formed in the stacked structure by a single etching process.

In some embodiments, two columns of memory cells distributed in the second direction are separated by the second trench.

Two of the bit line regions are comprised between the two columns of the memory cells, and two of the bit line regions are separated by the second trench.

Each memory cell region extends in the second direction, and a plurality of regions connected with the same bit line region are distributed on the same side of the bit line region in the first direction.

In some embodiments, forming a plurality of grooves by re-etching the plurality of insulation layers within the first trench includes: transversely etching each insulation layer exposed by the second trench and the first trench by a single wet etching process, until the insulation layer is in contact with only two adjacent surfaces between two adjacent dummy word lines.

In some embodiments, forming a conductive layer in each of the grooves includes: depositing a conductive layer in a first trench, a second trench and a groove between each sacrificial layer and each insulation layer; and etching and removing the conductive layer in the first trench and the second trench.

In some embodiments, disconnecting each conductive layer surrounding the dummy word line in the second direction includes: transversely etching the conductive layer exposed on a side wall of the first trench until the dummy word line is exposed on the side wall of the first trench.

In some embodiments, depositing a conductive layer in a first trench, a second trench and a groove between each sacrificial layer and each insulation layer includes: sequentially depositing an adhesion barrier layer and a metal layer in the first trench, the second trench and the plurality of grooves between each sacrificial layer and each insulation layer.

In some embodiments, the manufacturing method further includes: filling the grooves, the first trench and the second trench with an insulation material forming the insulation layers; and etching a stacked structure between two adjacent first trenches to form a third trench extending in the second direction, each third trench separating two of the via holes.

An embodiment of the present application provides a semiconductor device including: memory cells distributed in a multilayer array stacked and distributed in a direction perpendicular to a substrate, each memory cell including a transistor; a stacked structure including insulation layers and conductive layers alternately stacked on the substrate; wherein the stacked structure includes a plurality of via holes penetrating through the stacked structure and distributed at intervals in a first direction and a second direction, and each of the via holes is provided with a word line and a semiconductor layer surrounding the word line; in a column of the via holes distributed at intervals in the first direction, there is a first trench penetrating through the stacked structure and extending in the second direction every two via holes apart, and a third trench extending in the second direction is provided between every two adjacent first trenches; a bit line region located at an end of each of the first trenches and extending along the first direction; a second trench extending along the first direction and separating two adjacent bit line regions.

In some embodiments, the semiconductor device further includes: a first electrode and a second electrode extending in the second direction and distributed at intervals in the second direction in a conductive layer and on both sides of the word line.

The first electrode or the second electrode each includes two end faces in an extending direction and four side walls between the two end faces, and an end face of the first electrode or an end face of the second electrode close to the via holes is wrapped with an adhesion barrier layer.

In some embodiments, among the four side walls, only a side wall perpendicular to the substrate and close to the third trench and two side walls parallel to the substrate are wrapped with the adhesion barrier layer.

An embodiment of the present application also provides an electronic equipment including the semiconductor device as described above.

Other features and advantages of the present application will be set forth in the following specification, and moreover, partially become clearer from the specification, or are understood by implementing the present application. The objects and advantages of the present application can be realized and attained by the structure particularly indicated in the specification and drawings.

Other aspects may be understood upon reading and understanding the drawings and

BRIEF DESCRIPTION OF THE DRAWINGS

The accompanying drawings are used to provide an understanding of the technical schemes of the present application, and constitute a part of the specification. They are used to explain the technical schemes of the present application together with the embodiments of the present application, and do not constitute a limitation on the technical schemes of the present application.

DETAILED DESCRIPTION

Figure 1:
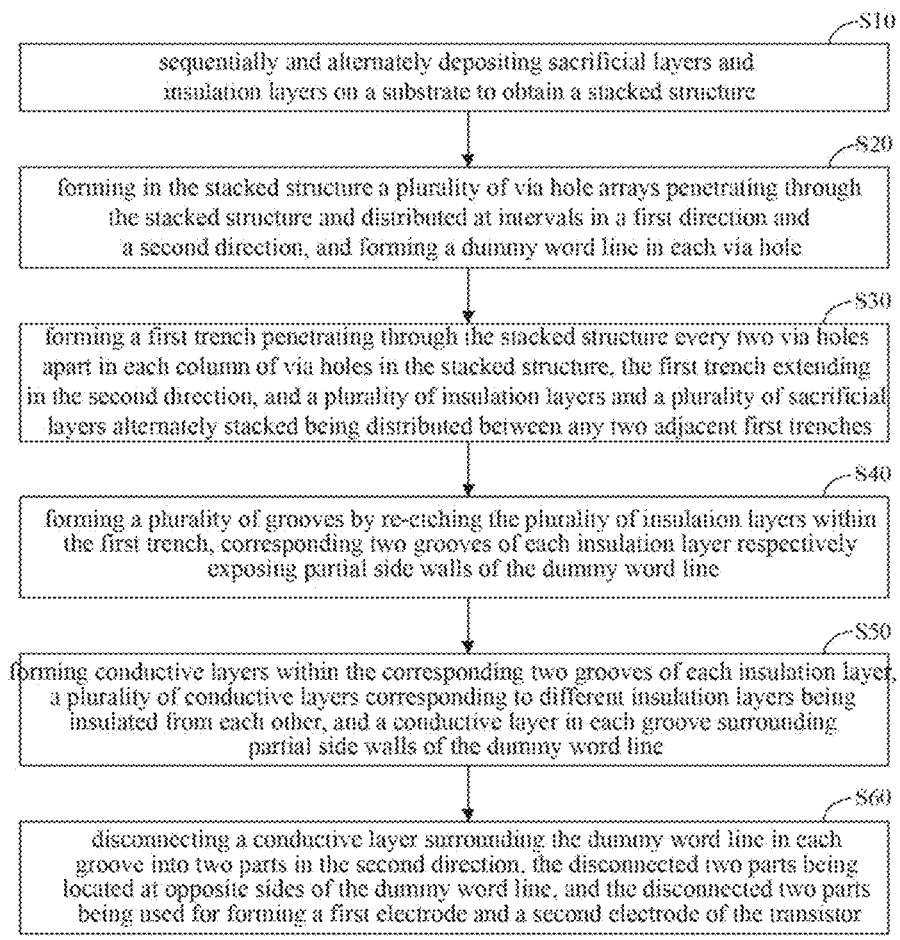
FIG. 1 is a process flow diagram of a manufacturing method for a semiconductor device according to an exemplary embodiment of the present application.

As required, detailed embodiments of the present disclosure are disclosed herein; however, it is to be understood that the disclosed embodiments are merely exemplary of the disclosure that may be embodied in various and alternative forms. The figures are not necessarily to scale; some features may be exaggerated or minimized to show details of particular components.

Therefore, specific structural and functional details disclosed herein are not to be interpreted as limiting, but merely as a representative basis for teaching one skilled in the art to variously employ the present disclosure.

To make objectives, technical solutions, and advantages of the present application clearer, embodiments of the present application will be described in detail below in conjunction with the drawings. It should be noted that the embodiments and the features of the embodiments of the present application may be arbitrarily combined with each other provided that there is no conflict.

Implementations of the present application are not necessarily limited to dimensions shown in the drawings, and the shapes and sizes of the components in the drawings do not reflect actual scales. Further, the drawings schematically illustrate ideal examples, but implementations of the present application are not limited to shapes or values shown in the drawings.

The size and proportion relationship between the various film layers or components in the drawings of the present application can be used as a reference in the actual process, and belong to implementations with better technical effect, but are not limited thereto. For example, an aspect ratio of a semiconductor layer, a thickness and spacing of each film layer can be adjusted according to actual needs.

Ordinal numerals such as "first" and "second" in the present application are provided to avoid confusion of constituent elements, but do not indicate any order, quantity or importance.

In the present application, for convenience, words or expressions indicating orientation or positional relationship such as "middle", "upper", "lower", "front", "rear", "vertical", "horizontal", "top", "bottom", "inner" and "outer" are employed to explain the positional relationship of the constituent elements with reference to the accompanying drawings, they are employed for case of description of the specification and simplification of the description only, but do not indicate or imply that the referred device or element must have a particular orientation, is constructed and operate in a particular orientation, and therefore cannot be construed as limitations on the present application. The positional relationship of the constituent elements is appropriately changed according to the direction in which each constituent element is described. Therefore, the positional relationship is not limited to the words or expressions described in the present disclosure, and replacement may be appropriately made according to the situation.

In the present application, the terms "mount", "couple" and "connect" should be understood broadly, unless otherwise expressly specified and defined. For example, it may be a fixed connection, a detachable connection, or an integral connection; it may be a mechanical connection or an electrical connection; it may be a direct connection, an indirect connection through a middleware, or an internal communication between two elements. For those of ordinary skills in the art, the specific meaning of the above terms in the present application may be understood according to actual situations.

In the present application, a transistor refers to an element including at least three terminals, i.e., a gate electrode, a drain electrode, and a source electrode. A transistor has a channel area between a drain electrode (drain electrode terminal, drain area, or drain electrode) and a source electrode (source electrode terminal, source area, or source electrode), and a current may flow through the drain electrode, the channel area, and the source electrode. In the present application, the channel area refers to an area through which the current mainly flows.

In the present application, the first electrode may be a drain electrode and the second electrode may be a source electrode, or the first electrode may be a source electrode and the second electrode may be a drain electrode. In a case where transistors with opposite polarities are used or in a case where a direction of a current changes during working of a circuit, or the like, functions of the "source electrode" and the "drain electrode" are sometimes interchanged with each other. Therefore, in the present application, the "source electrode" and the "drain electrode" may be interchangeable with each other unless specifically stated.

In the present application, "electrical connection" or "connection" includes a case where constituent elements are connected together through an element with a certain electrical effect, such as electrical signal connection (coupling connection, such as coupled to), or physical direct connection. There is no special restriction on an "element with certain electrical effect" as long as it can transmit and receive electrical signals between connected constituent elements. Examples of the "element with certain electrical effect" include not only electrodes and wiring, but also switching elements (such as transistors), resistors, inductors, capacitors, and other elements having various functions, etc.

In the present application, "parallel" refers to approximately parallel or almost parallel, for example, a state in which the angle formed by two straight lines is −10 degrees or more and 10 degrees or less, and therefore also includes a state in which the angle is −5 degrees or more and 5 degrees or more. In addition, "perpendicular" refers to approximately perpendicular, for example, a state in which the angle formed by two straight lines is 80 degrees or more and 100 degrees or less, and therefore also includes a state in which the angle is 85 degrees or more and 95 degrees or less.

In some embodiments of the present application, the "film" and "layer" may be interchangeable with each other. For example, "conductive layer" may sometimes be replaced by "conductive film". Similarly, "insulation film" may sometimes be replaced by "insulation layer".

In the present application, "A and B are arranged in the same layer" means that A and B are distributed in the same horizontal plane, or although they are not in the same horizontal plane, they are all in different areas in the same supporting plane. In one embodiment, A and B are formed simultaneously through a same patterning process on a same film layer.

"A and B are of an integral structure" in embodiments of the present application may mean that there is no obvious boundary interface, such as obvious faultage or gaps, viewed from the microstructure. Generally, the connected film layers formed by patterning on one film layer are of an integral structure. For example, A and B use the same material to form a film layer and form a structure with connection relationship simultaneously through the same patterning process, or B is directly grown on A epitaxially, and the materials of the two may not be completely the same.

In the present application, the distribution at intervals can be understood as an independent and separated distribution, which can be a disconnection in physical structure to realize the spacing, and can also be a disconnection in electrical characteristics. For example, the semiconductor layer between the corresponding effective channels of two transistors is modified to achieve insulation to achieve electrical spacing between the two channels.

In order to obtain higher integration, the memory is gradually developing to three-dimensional (3D) structure.

For 3D stacked devices, an embodiment is to alternately deposit conductive layers and insulation layers on a substrate to form a stacked structure of conductive layers/insulation layers, and then fabricate transistors in the stacked structure. A conductive layer is used for making at least a source electrode and a drain electrode of a transistor, and an insulation layer is used for isolating the stacked transistors.

Due to the stacked structure of conductive layers/insulation layers, the process requirements or cost requirements for fabricating stacked transistors are relatively high. In some embodiments, an insulation layer and a sacrificial layer are employed to form a stacked structure, and the sacrificial layer in the stacked structure is subsequently replaced with a conductive layer. However, this replacement method is to isolate multiple transistors connected to each bit line from each other, remove the sacrificial layers between insulation layers and fill the conductive layers, so that there is a hollowed-out area after the sacrificial layers are removed, and the stacked structure is easy to collapse.

An embodiment of the present application provides a manufacturing method for a semiconductor device including memory cells of different layers stacked and distributed in a direction perpendicular to a substrate, each memory cell including a transistor.

FIG. 1 is a process flow diagram of a manufacturing method for a semiconductor device according to an exemplary embodiment of the present application. As shown in FIG. 1, the manufacturing method includes:

S10: sequentially and alternately depositing sacrificial layers and insulation layers on a substrate to obtain a stacked structure;

S20: forming in the stacked structure a plurality of via holes penetrating through the stacked structure and distributed at intervals in a first direction, and forming dummy word lines in the via holes;

S30: forming a first trench penetrating through the stacked structure every two via holes apart in the stacked structure, the first trench extending in a second direction, and a plurality of insulation layers and a plurality of sacrificial layers alternately stacked being distributed between any two adjacent first trenches;

S40: forming a plurality of grooves by re-etching the plurality of insulation layers within the first trench, partial side walls of a dummy word line being respectively exposed in the corresponding two grooves of each insulation layer;

S50: forming conductive layers within the corresponding two grooves of each insulation layer, a plurality of conductive layers corresponding to different insulation layers being insulated from each other, and a conductive layer in each groove surrounding the partial side walls of the dummy word line; and S60: disconnecting a conductive layer surrounding a dummy word line in each groove into two parts in the second direction, the disconnected two parts being located at opposite sides of the dummy word line, and the disconnected two parts being used for forming a first electrode and a second electrode of the transistor.

In a manufacturing method for a semiconductor device according to an embodiment of the present application, when conductive layer replacement is performed, a trench is not formed between every two AAs (subsequently used for forming a transistor or a memory cell region), but there is a monolithic structure, and a trench is provided between two monolithic structures. In the monolithic structure, replacing with the conductive layer is performed from a trench side, so that the whole insulation layer will not be hollowed out during replacement, but only an area where the conductive layer is formed needs to be hollowed out, and an area between the two conductive layers for isolating the two transistors is supported by the insulation layer, so that the mechanical stability during replacement is good. After the replacement is completed, the two transistors are isolated by trenches.

A technical solution of an embodiment of the present application is further explained below by a manufacturing process of a semiconductor device of an exemplary embodiment.

FIGS. 2 to 15E are cross-sectional views of a structure obtained by each step of a manufacturing method for a semiconductor device provided by an exemplary embodiment of the present application in a C1 plane parallel to a substrate and a C2 plane and a C3 plane perpendicular to the substrate, and the C2 and C3 planes are perpendicular to each other.

As shown in FIGS. 2 to 15E, in an exemplary embodiment, the manufacturing method for a semiconductor device may include the following process.

Figure 2:
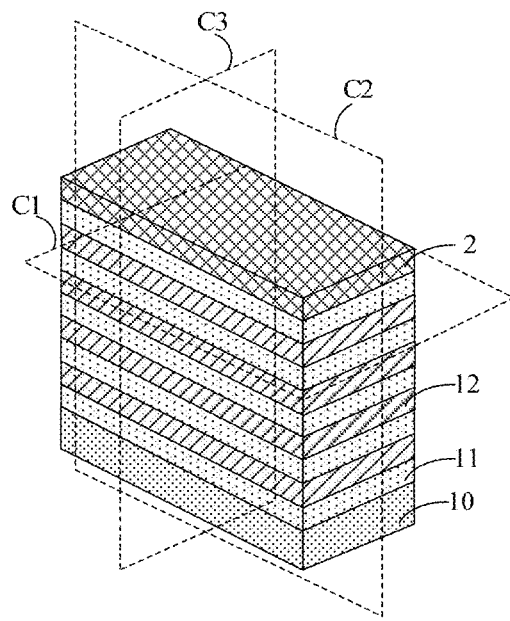
FIG. 2 is a schematic diagram of a three-dimensional structure of a manufacturing method for a semiconductor device provided by an exemplary embodiment of the present application after forming a stacked structure.

S10: providing a substrate 10, and sequentially and alternately depositing sacrificial layers 11 and insulation layers 12 on the substrate 10, to obtain a stacked structure composed of the sacrificial layers 11 and the insulation layers 12 which are distributed in a stacked manner, as shown in FIG. 2.

A substrate in an embodiment of the present application can be understood as a support structure of a memory cell, such as a silicon substrate, or a support structure on which other film layers or functions or circuits have been distributed on the silicon substrate. The inventive configuration of an embodiment of the present application relates to a device disposed on a major surface of a support structure.

A material of the insulation layers and a material of the sacrificial layers are different so that when one of the sacrificial layers and the insulation layers is removed subsequently by etching, the sacrificial layers and the insulation layers may have different etching rates to remove the insulation layer desired to be removed. For example, in this embodiment, the material of the insulation layers may be a low-K material such as silicon oxide, and the material of the sacrificial layers is another insulation material.

Exemplarily, the material of the insulation layers may be a low-K dielectric material, i.e. a dielectric material having a dielectric constant K<3.9, including but not limited to an oxide of silicon such as silicon dioxide ($SiO_2$) or the like.

Exemplarily, the material of the sacrificial layers may be polycrystalline silicon (poly-Si), or the material of the sacrificial layers may be polycrystalline silicon germanium (poly-GeSi), or the material of the sacrificial layers may be any one of silicon oxynitride (SiON), silicon nitride (SiN), and silicon carbonitride (SiCN).

The stacked structure shown in FIG. 2 includes five sacrificial layers 11 and four insulation layers 12, only as an example, and in some other embodiments, the stacked structure may include more or fewer insulation layers 11 and insulation layers 12 disposed alternately.

Figure 3A:
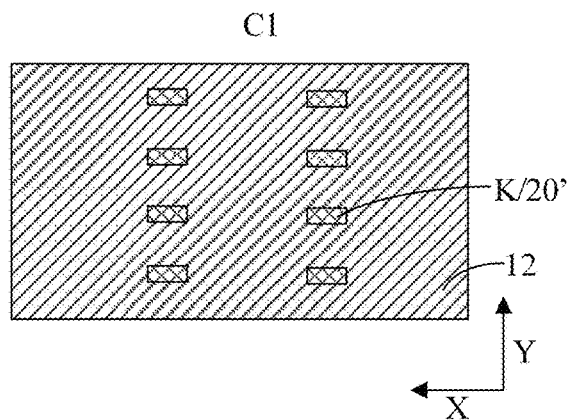
FIG. 3A is a cross-sectional view of a manufacturing method for a semiconductor device provided by an exemplary embodiment of the present application in a C1 plane parallel to a substrate after forming dummy word lines.
Figure 3B:
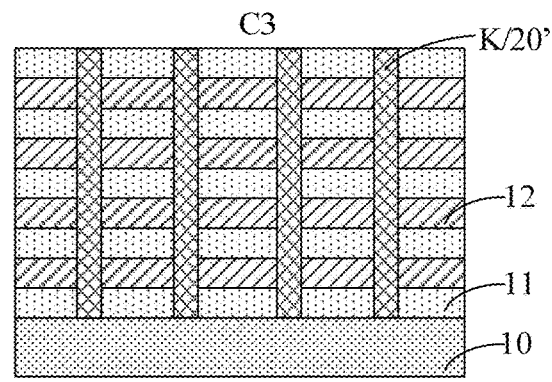
FIG. 3B is a cross-sectional view of a structure shown in FIG. 3A in a C3 plane perpendicular to a substrate.

S20: etching the stacked structure, such as by dry etching, in a direction toward the substrate 10 to form a plurality of arrays of via holes K distributed at intervals as shown in FIGS. 3A and 3B in the stacked structure, and forming a dummy word line 20' in each via hole K for temporarily filling the via holes K, which is subsequently replaced by a real word line.

Exemplarily, the step S20 may include:

S21: defining a photolithography pattern using a photolithography method, and etching the stacked structure in a direction toward the substrate 10 to form a plurality of via holes K distributed at intervals in the stacked structure, wherein each via hole K may penetrate the stacked structure and extend to a surface or inside of the substrate 10, and each via hole K may extend in a direction perpendicular to the substrate 10; the plurality of via holes K may be distributed at intervals in the first direction (also referred to as a column direction) and the second direction (also referred to as a row direction) to form a via hole array;

S22: depositing a material for forming dummy word lines on the substrate 10, and planarizing the material for dummy word lines on a surface of the substrate 10 using a chemical mechanical polishing (CMP) process, until an insulation layer 12 on a surface of the stacked structure is exposed, and the material for dummy word lines in the via holes K is retained to form dummy word lines 20'.

Exemplarily, the first direction crosses the second direction, for example the first direction and the second direction may be perpendicular to each other. The first direction may be parallel to the substrate 10, for example may be the Y direction as shown by FIG. 3A. The second direction may be parallel to the substrate 10, for example may be the X direction as shown in FIG. 3A.

Exemplarily, a material of a dummy word line may be a material having an etch selectivity ratio with the insulation layer or the sacrificial layer.

For example, the material of the dummy word line may be any one or more of silicon oxide (e.g. $SiO_2$), silicon oxynitride (SiON), silicon nitride (SiN), silicon carbonitride (SiCN), aluminum oxide ($Al_2O_3$), but the material of the dummy word line is different from the material of the sacrificial layers and the material of the insulation layers so that the dummy word lines 20' are not etched away when the sacrificial layers and the insulation layers are removed subsequently by etching.

Exemplarily, the material of the dummy word line may be other materials different from the material of the insulation layers and the material of the sacrificial layers. For example, the material of the dummy word line may be $Al_2O_3$, the material of the sacrificial layers may be SiN, and the material of the insulation layers may be $SiO_2$.

Exemplarily, the step S20 may also include:

S23: forming a support layer 13 extending in the first direction in the stacked structure.

Exemplarily, the semiconductor device may include a plurality of memory cell groups periodically distributed in the second direction. The memory cell groups includes two columns of memory cells adjacent in the second direction and two bit lines located between the two columns of memory cells, and the support layer 13 is used for supporting and separating two memory cell groups adjacent in the second direction.

Figure 4A:
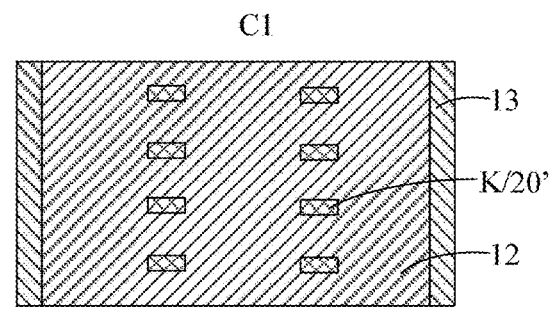
FIG. 4A is a cross-sectional view of a manufacturing method for a semiconductor device provided by an exemplary embodiment of the present application in a C1 plane parallel to a substrate after forming a support layer.
Figure 4B:
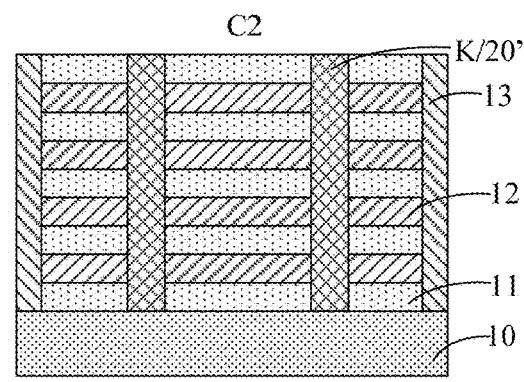
FIG. 4B is a cross-sectional view of a structure shown in FIG. 4A in a C2 plane perpendicular to a substrate.

The step S23 may include:

S231: etching the stacked structure in a direction toward the substrate 10 to form a plurality of spacing trenches extending in the first direction in the stacked structure, there being two via holes K in the second direction between two adjacent spacing trenches;

S232: depositing a support layer 13 filling the spacing trenches on the substrate 10, and planarizing the support layer 13 on a surface of the substrate 10 by using a CMP process, until an insulation layer 12 on a surface of the stacked structure is exposed, and the support layer 13 in the spacing trenches is retained to provide support for a memory repeating cell to be formed and separate two adjacent memory repeating cells, as shown in FIGS. 4A and 4B. Here, FIG. 4A is a cross-sectional view in the C1 plane, and the C1 plane passes through an insulation layer 12; and FIG. 4B is a cross-sectional view in the C2 plane, and the C2 plane passes through via holes K.

Exemplarily, the spacing trenches may penetrate through the stacked structure and extend to a surface or inside of the substrate 10, and the spacing trenches may extend in a direction perpendicular to the substrate 10 and the first direction, thereby forming a support layer 13 extending in the first direction.

Exemplarily, a material of the support layer may be any one or more of silicon oxide (e.g. $SiO_2$), silicon oxynitride (SiON), silicon nitride (SiN), silicon carbonitride (SiCN), but the material of the support layer is different from the material of the sacrificial layers and the material of the insulation layers so that the support layer is not etched away when the sacrificial layers and the insulation layers are removed subsequently by etching.

Exemplarily, step S23 may be performed after step S22 or before step S21.

Figure 5A:
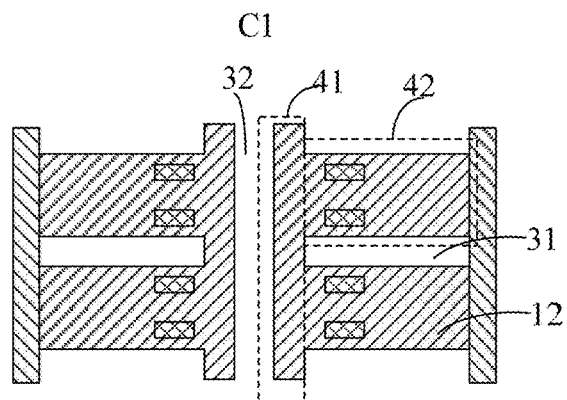
FIG. 5A is a cross-sectional view of a manufacturing method for a semiconductor device provided by an exemplary embodiment of the present application in a C1 plane parallel to a substrate after completion of a first patterning etching.
Figure 5B:
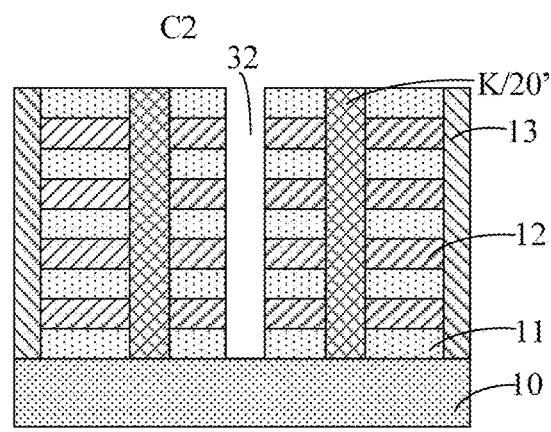
FIG. 5B is a cross-sectional view of a structure shown in FIG. 5A in a C2 plane perpendicular to a substrate.
Figure 5C:
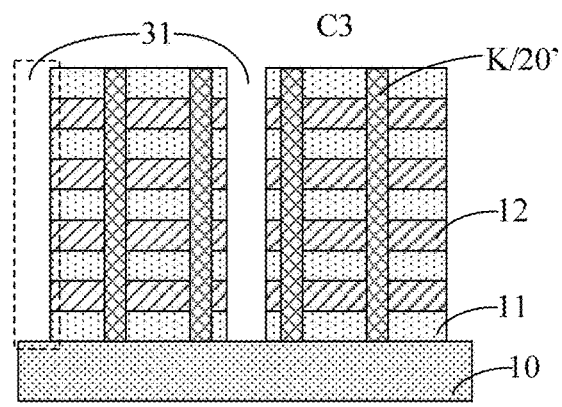
FIG. 5C is a cross-sectional view of a structure shown in FIG. 5A in a C3 plane perpendicular to a substrate.

S30: forming a first trench 31 penetrating through the stacked structure every two adjacent via holes in each column of via holes in the stacked structure. The first trench 31 extends in the second direction and extends to expose the support layer 13 at one end and expose sacrificial layers 11 and insulation layers 12 alternately stacked at the other end. A plurality of insulation layers 12 and a plurality of sacrificial layers 11 alternately stacked are distributed between any two adjacent first trenches 31, and the patterns on the insulation layers 12 and the sacrificial layers 11 contain only two via holes spaced in the first direction. After the first trench 31 is formed, the sacrificial layers 11 and the insulation layers 12 penetrated by a column of via holes K are each continuous film layers, as shown in FIGS. 5A and 5B. Here, FIG. 5A is a cross-sectional view in the C1 plane, and the C1 plane passes through an insulation layer 12; FIG. 5B is a cross-sectional view in the C2 plane, and the C2 plane passes through via holes K; and FIG. 5C is a cross-sectional view in the C3 plane, and the C3 plane passes through via holes K.

Exemplarily, the step S30 forms a second trench 32 while forming the first trench 31.

Specifically, a single etching process is performed on the stacked structure in a direction toward the substrate 10, while a plurality of second trenches 32 extending in the first direction and a plurality of first trenches 31 extending in the second direction are formed in the stacked structure. The plurality of first trenches 31 are distributed at intervals in the first direction. A second trench 32 is formed every two columns of via holes. An insulation layer 12 of each layer and a sacrificial layer 11 of each layer on the same side of the second trench 32 are integrally and continuously distributed film layers, respectively. The second trenches 32 and the spacing trenches formed in step S23 are arranged at intervals in the second direction.

The first trenches 31 and the second trenches 32 separates the stacked structure into a bit line region 41 extending in the first direction and a plurality of memory cell regions 42 connected to the bit line region 41. The bit line region 41 and the insulation layers 12 of the memory cell region 42 are an integrated structure. The bit line region 41 and the conductive layers 14 of the memory cell region 42 are an integrated structure. Each memory cell region 42 in the drawings includes two memory cells arranged at intervals in the column direction. A bit line region 41 extending in the first direction is included between the second trench 32 and the first trenches 31 corresponding to a column of memory cells. A memory cell region 42 is included between every two adjacent first trenches 31 in the column direction. Two bit line regions 41 are included between every two columns of memory cells, and a second trench 32 separates two adjacent bit line regions 41.

The bit line region 41 is an area for subsequently forming a bit line and the memory cell region 42 includes an area for subsequently forming two transistors and an area for subsequently forming a capacitor in which the two transistors are connected. Each bit line region 41 extends in a length direction in the first direction, each memory cell region 42 extends in a length direction in the second direction, and a plurality of memory cell regions 42 connected with the same bit line region 41 are distributed at intervals in the first direction on the same side of the bit line region 41 and separated by the first trench 31. A side of the bit line region 41 that is not connected to the memory cell region 42 is adjacent to the other bit line region 41, and the two adjacent bit line regions 41 are separated by a second trench 32. Each memory cell region 42 is penetrated by two via holes K distributed in the first direction, and via holes K penetrating through the same memory cell region 42 are all distributed in the first direction. In FIG. 5A, each memory cell region 42 is penetrated by two via holes K and the two via holes K are distributed at intervals in the first direction. The via holes K are located in an area of a memory cell region 42 close to a bit line region 41.

Exemplarily, the first trench 31 and the second trench 32 may be formed using dry etching.

Figure 6A:
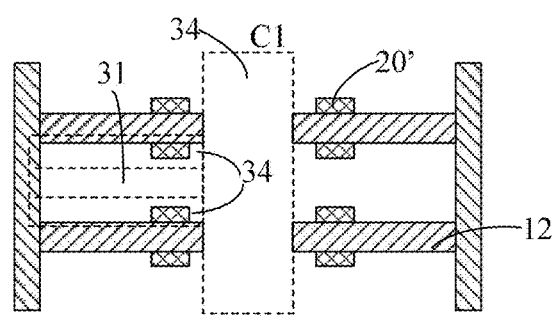
FIG. 6A is a cross-sectional view of a manufacturing method for a semiconductor device provided by an exemplary embodiment of the present application in a C1 plane parallel to a substrate after transverse etching of an insulation layer.
Figure 6B:
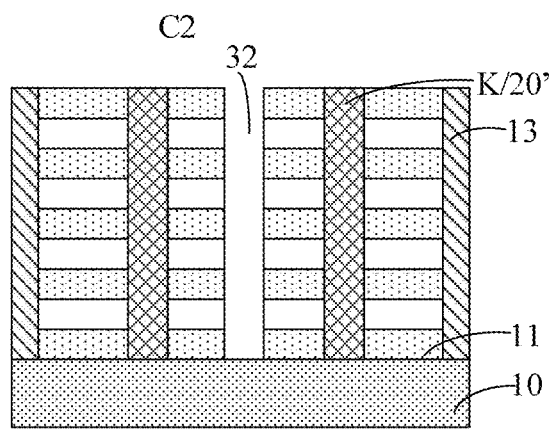
FIG. 6B is a cross-sectional view of a structure shown in FIG. 6A in a C2 plane perpendicular to a substrate.
Figure 6C:
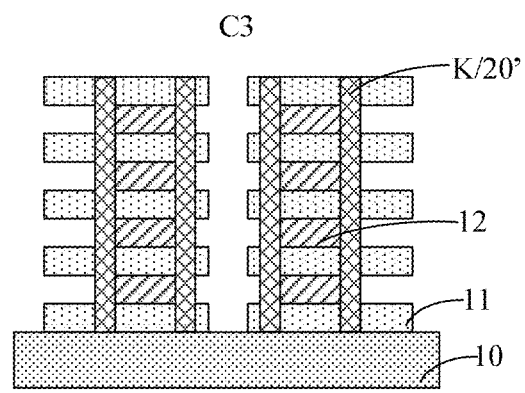
FIG. 6C is a cross-sectional view of a structure shown in FIG. 6A in a C3 plane perpendicular to a substrate.

S40: After step 30, side walls of the insulation layers 12 and side walls of the sacrificial layers 11 in the first trenches 31 and the second trenches 32 are exposed. The insulation layers 12 are etched transversely in the first trenches 31 and the second trenches 32 by a single etching process until the insulation layers 12 are only in contact with two adjacent faces between two adjacent dummy word lines 20', forming a plurality of grooves 34. For example, the insulation layers 12 extending in the second direction between two dummy word lines 20' of the same memory cell region 42 in the insulation layers 12 can be retained, so that two grooves 34 with opposite openings are formed respectively in the memory cell regions 42 on both sides of each first trench 31, while the insulation layers 12 of the bit line regions 41 are also etched to form a groove 34. Each groove 34 of the memory cell regions 42 exposes a partial side wall of a dummy word line 20', and two grooves 34 in the same first trench 31 respectively expose partial side walls of a dummy word line 20'. Here, a partial side wall of a dummy word line 20' refers to a portion of a side wall of the dummy word line 20' located between two sacrificial layers 11, rather than a part of side walls of the entire dummy word line 20', as shown in FIGS. 6A to 6C. Here, FIG. 6A is a cross-sectional view in the C1 plane, and the C1 plane passes through an insulation layer 12; FIG. 6B is a cross-sectional view in the C2 plane, and the C2 plane passes through via holes K; and FIG. 6C is a cross-sectional view in the C3 plane, and the C3 plane passes through via holes K. The plurality of grooves 34 include grooves for accommodating first and second electrodes of a transistor and a groove for accommodating a bit line.

Exemplarily, step S40 may remove the insulation layers 12 by wet etching, including: etching the insulation layers 12 on an exposed side of the bit line regions 41 in the second trench 32, thereby removing the insulation layers 12 located in the bit line regions 41 and forming a groove 34 located in the bit line regions 41; and in two adjacent first trenches 31, respectively etching the insulation layers 12 on both exposed sides of the memory cell region 42 between the two first trenches 31, so that the insulation layers 12 located in the memory cell region 42 are partially etched off from both sides in the first direction, leaving only the insulation layers 12 between two via holes K corresponding to one memory cell region 42 distributed in the first direction.

Exemplarily, a via hole K may be rectangular, circular, oval, or the like.

In step S40, the insulation layers 12 are etched from both sides of the memory cell region 42, and an etching amount can be controlled by etching time, so that a large area of the insulation layers 12 can be retained as much as possible. The retained insulation layers 12 can provide support for the patterned sacrificial layers 11 stacked thereon, while the support layer 13 and the dummy word lines 20' can also provide support for the patterned sacrificial layers 11, making the patterned sacrificial layers 11 more mechanically stable.

S50: depositing a conductive layer 14 in each groove 34. Two adjacent columns of memory cells in the second direction in each layer correspond to two mutually insulated conductive layers 14, and the two mutually insulated conductive layers 14 surround two different dummy word lines 20' respectively.

Figure 7A:
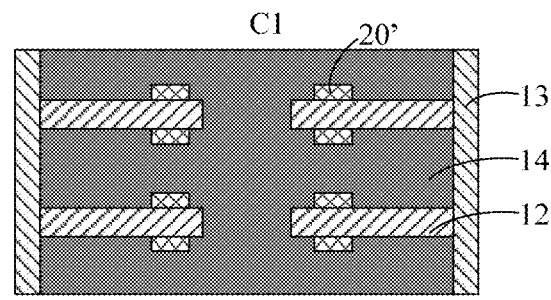
FIG. 7A is a cross-sectional view of a manufacturing method for a semiconductor device provided by an exemplary embodiment of the present application in a C1 plane parallel to a substrate after formation of a conductive layer.
Figure 7B:
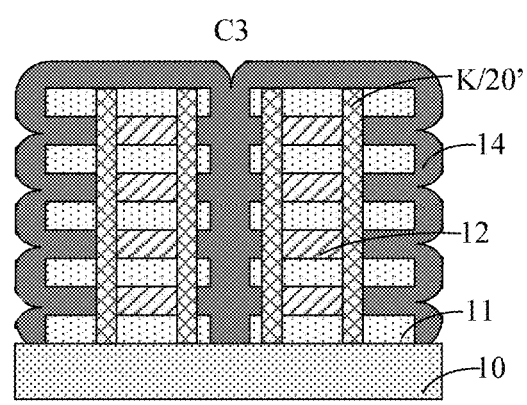
FIG. 7B is a cross-sectional view of a structure shown in FIG. 7A in a C3 plane perpendicular to a substrate.

Exemplarily, the step S50 includes:

S51: depositing a conductive layer 14 in the first trench 31, the second trench 32, and the groove 34 between each patterned sacrificial layer 11 and each patterned insulation layer 12, as shown in FIGS. 7A and 7B. Here, FIG. 7A is a cross-sectional view in the C1 plane, and the C1 plane passes through an insulation layer 12; and FIG. 7B is a cross-sectional view in the C3 plane, and the C3 plane passes through via holes K.

Since a part of the insulation layers 12 is retained in step S40 to support the sacrificial layers 11, the stability of the structure is high before a conductive layer 14 is deposited, and a risk of collapse of the structure when the conductive layer 14 is deposited is reduced. In addition, a method according to an embodiment of the present application can simultaneously deposit a conductive layer 14 between two adjacent sacrificial layers 11 from multiple angles through each of the first trenches 31, the second trenches 32 and the grooves 34, which can further reduce a risk of collapse of the structure when depositing the conductive layer 14.

Exemplarily, a material of the conductive layer may be selected from any one or more of other metallic materials containing tungsten, molybdenum, cobalt, or the like having similar properties. The conductive layer may be a single-layer structure or a multi-layer structure, for example, may be a multi-layer structure formed of titanium (Ti), titanium nitride (TiN) and tungsten (W).

Exemplarily, step S51 may include sequentially depositing an adhesion barrier layer and a metal layer constituting a conductive layer 14 of a double-layer structure in the first trench 31, the second trench 32 and the groove 34 between each patterned sacrificial layers 11 and each patterned insulation layers 12 using an atomic layer deposition (ALD) process. On the one hand, the adhesion barrier layer can be used as an adhesion layer to improve the adhesion between a surface of a metal layer to be deposited and a metal layer, and on the other hand, it can be used as a barrier layer to prevent the metal in a metal layer from diffusing into other film layers. For example, a material of the adhesion barrier layer may be titanium nitride (TiN).

Figure 8A:
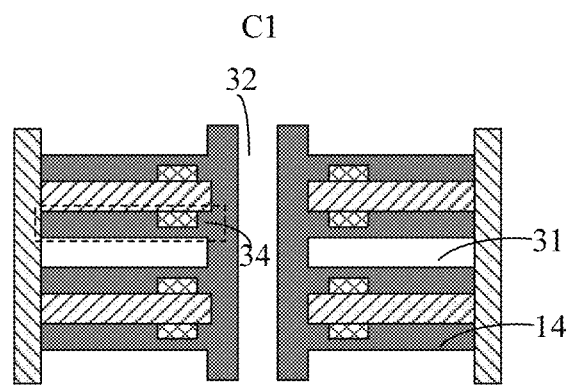
FIG. 8A is a cross-sectional view of a manufacturing method for a semiconductor device provided by an exemplary embodiment of the present application in a C1 plane parallel to a substrate after etching and removing conductive layers in a first trench and a second trench.
Figure 8B:
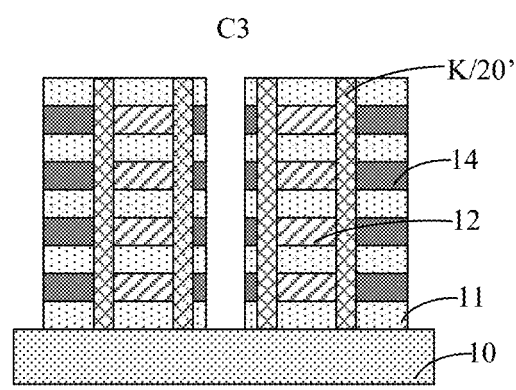
FIG. 8B is a cross-sectional view of a structure shown in FIG. 8A in a C3 plane perpendicular to a substrate.

S52: etching and removing the conductive layers 14 in the first trenches 31 and the second trenches 32, and retaining the conductive layers 14 in the grooves 34. Two adjacent columns of memory cells in the second direction in each layer correspond to two mutually insulated conductive layers 14, and the two mutually insulated conductive layers 14 surround two different dummy word lines 20' respectively, as shown in FIGS. 8A and 8B. Here, FIG. 8A is a cross-sectional view in a C1 plane, and the C1 plane passes through an insulation layer 12; and FIG. 8B is a cross-sectional view in a C3 plane, and the C3 plane passes through via holes K.

Exemplarily, step S52 may include: removing the conductive layers 14 in the second trenches 32 and the first trenches 31 by dry etching. For example, a pattern formed by the retained conductive layer 14 and the insulation layer on the same layer with the conductive layer can be the same as that of a sacrificial layer after the first patterning and etching. In addition, a side wall of a first trench 31 does not expose a dummy word line 20', that is, the remaining conductive layer 14 surrounds (around) a side wall of the dummy word line 20' exposed by the groove 34 in step S40. That is, as shown in FIG. 8A, a conductive layer 14 with a certain width is left between the dummy word line 20' and the first trench 31 in the first direction.

Figure 9A:
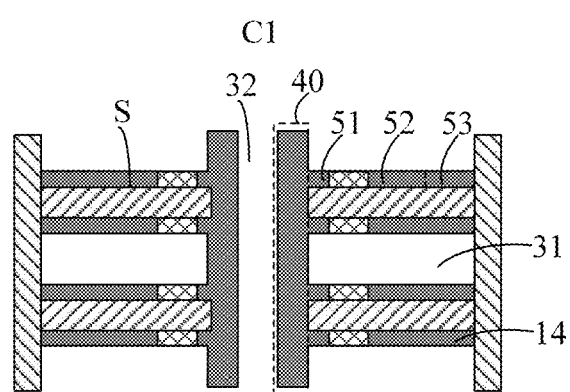
FIG. 9A is a cross-sectional view of a manufacturing method for a semiconductor device provided by an exemplary embodiment of the present application in a C1 plane parallel to a substrate after forming a first electrode and a second electrode.
Figure 9B:
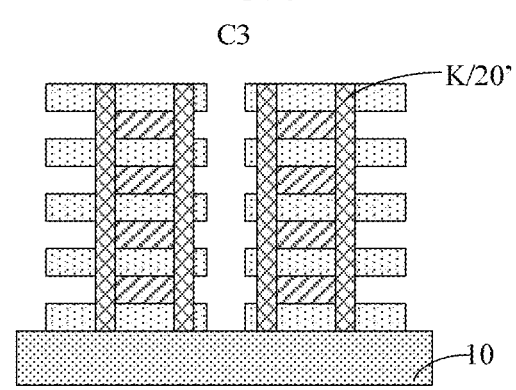
FIG. 9B is a cross-sectional view of a structure shown in FIG. 9A in a C3 plane perpendicular to a substrate.

S60: Transversely etching a conductive layer 14 exposed on a side wall of a first trench 31 until the side wall of the first trench 31 exposes a side wall of a dummy word line 20' close to the first trench 31, and a conductive layer 14 on opposite sides of each dummy word line 20' in the second direction is disconnected by the dummy word line 20' in a via hole K, one part of which serves as a first electrode 51 of a transistor and a bit line 40 integrally connected with the first electrode 51, and the other part of which serves as a second electrode 52 of the transistor and a third electrode of a capacitor, as shown in FIGS. 9A and 9B. Here, FIG. 9A is a cross-sectional view in a C1 plane, and the C1 plane passes through an insulation layer 12; and FIG. 9B is a cross-sectional view in a C3 plane, and the C3 plane passes through via holes K.

Exemplarily, step S60 may include: transversely etching a conductive layer 14 exposed on a side wall of a first trench 31 by wet etching until the side wall of the first trench 31 exposes a surface of the dummy word line 20' facing the first trench 31, and a conductive layer 14 extending in the second direction on both sides of each dummy word line 20' is disconnected by the dummy word line 20' in a via hole K. For example, conductive layers 14 on both sides of a first trench 31 may be etched off by a certain width respectively. After etching, the resulting conductive layers 14 include a bit line 40 located in a bit line region, a first electrode 51 and a second electrode 52 of a transistor located in a memory cell region 42, and a third electrode of a capacitor. The bit line 40 is connected to the first electrode 51, and the first electrode 51 and the second electrode 52 are separated by a via hole K. The conductive layers 14 obtained in step S60 may also include a third electrode 61 connected to the second electrode 52, and the third electrode 61 serves as an internal electrode of a capacitor connected to a transistor where the second electrode 52 is located.

When a conductive layer consisting of an adhesion barrier layer and a metal layer is deposited in grooves on both sides of an insulation layer 12, the adhesion barrier layer is first deposited in the grooves on both sides of the insulation layer 12, so that a contact surface S between the first electrode 51 and the second electrode 52 obtained in step S60 and the insulation layer 12 may have an adhesion barrier layer.

Figure 10A:
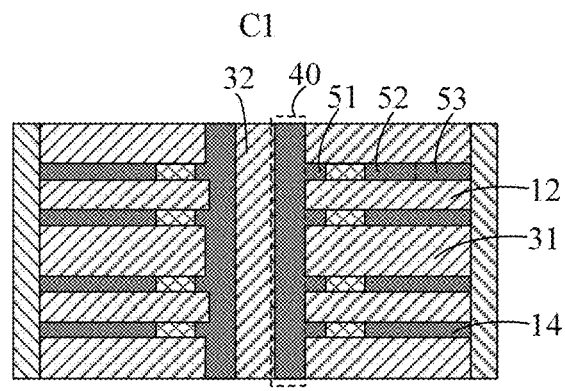
FIG. 10A is a cross-sectional view of a manufacturing method for a semiconductor device provided by an exemplary embodiment of the present application in a C1 plane parallel to a substrate after the first trench and the second trench are filled with insulation layer material.
Figure 10B:
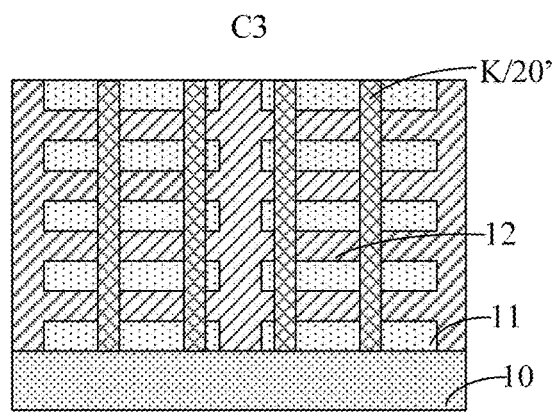
FIG. 10B is a cross-sectional view of a structure shown in FIG. 10A in a C3 plane perpendicular to a substrate.

S70: filling the second trenches 32, the first trenches 31 and the grooves 34 with an insulation material forming the insulation layer. The insulation layer and the material in the trenches serve as an isolation layer between the devices, as shown in FIGS. 10A and 10B. Here, FIG. 10A is a cross-sectional view in a C1 plane, and the C1 plane passes through an insulation layer 12; and FIG. 10B is a cross-sectional view in a C3 plane, and the C3 plane passes through via holes K.

At this time, a conductive layer between two adjacent first trenches includes conductive layers of two transistors, and needs to be etched into two groups of conductive layers, each group of conductive layers including first electrodes and second electrodes arranged in the second direction, which will be realized by step S80.

Exemplarily, the adhesion barrier layer exposes a partial side wall of a via hole K located in a conductive layer 14, where the partial side wall of the via hole K is a side wall in a circumferential direction of the via hole K rather than a side wall in a direction perpendicular to the substrate. For example, in FIG. 10A, the via hole is rectangular and has four side walls, but only three side walls in contact with a conductive layer and an insulation layer are covered by the adhesion barrier layer, and the other side wall is exposed.

Figure 11A:
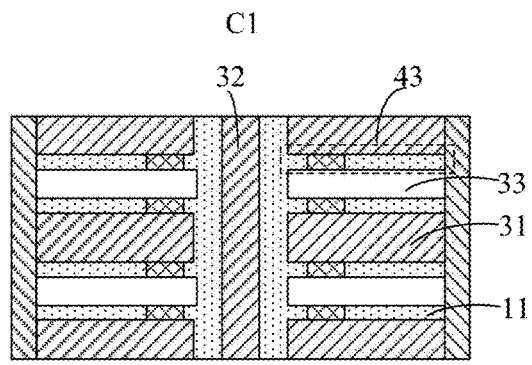
FIG. 11A is a cross-sectional view of a manufacturing method for a semiconductor device provided by an exemplary embodiment of the present application in a C1 plane parallel to a substrate after forming a memory cell.
Figure 11B:
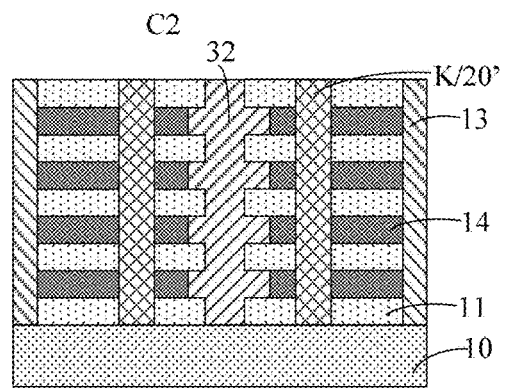
FIG. 11B is a cross-sectional view of a structure shown in FIG. 11A in a C2 plane perpendicular to a substrate.
Figure 11C:
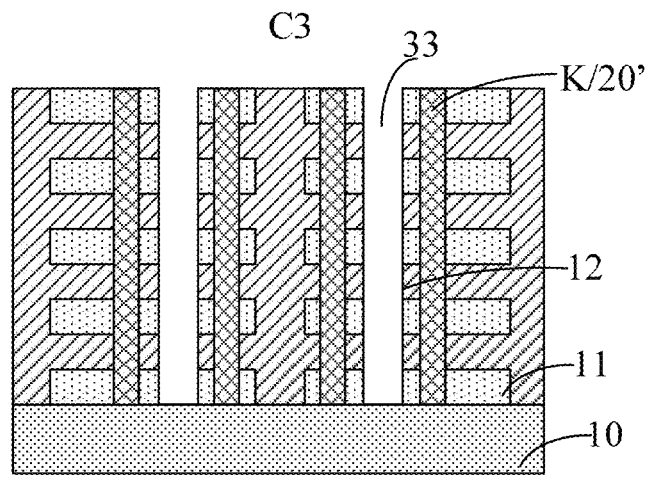
FIG. 11C is a cross-sectional view of a structure shown in FIG. 11A in a C3 plane perpendicular to a substrate.

S80: patterning and etching a stacked structure between two adjacent first trenches 31 in a direction toward the substrate 10 to separate each memory cell region into two memory cells 43 such that each memory cell 43 is penetrated by only one via hole K instead of simultaneously being penetrated by two via holes arranged in the first direction, as shown in FIGS. 11A to 11C. Here, FIG. 11A is a cross-sectional view in a C1 plane, and the C1 plane passes through a sacrificial layer 11; FIG. 11B is a cross-sectional view in a C2 plane, and the C2 plane passes through via holes K; and FIG. 11C is a cross-sectional view in a C3 plane, and the C3 plane passes through via holes K.

Exemplarily, step S80 may include: patterning and etching a stacked structure between two adjacent first trenches 31 in a direction toward the substrate 10 to form a third trench 33 extending in the second direction between two adjacent via holes K of the stacked structure. The third trench 33 separates each memory cell region 42 into two memory cells 43 as shown in FIG. 11A, each memory cell including two first and second electrodes spaced from each other. Each of the memory cells 43 is penetrated by only one via hole K. In FIG. 11A, the third trench 33 separates each memory cell region 42 of the sacrificial layer 11 into two memory cells 43.

If the first electrode and the second electrode are not disconnected by the third trench, the memory cell region can be re-etched until the first electrode and the second electrode are disconnected.

S90: filling the third trench and fabricate a capacitor.

Specifically, an insulation material of the same material as the stacked insulation layer is deposited on the substrate 10, such that the third trench 33 is filled with the insulation material. The insulation material on a surface of the substrate 10 is planarized by a CMP process until the sacrificial layer 11 on a surface of the substrate 10 is exposed.

The first electrode, the second electrode and the third electrode extend along the same direction, and the second electrode and the third electrode extend along one direction in an integrated structure.

Figure 12A:
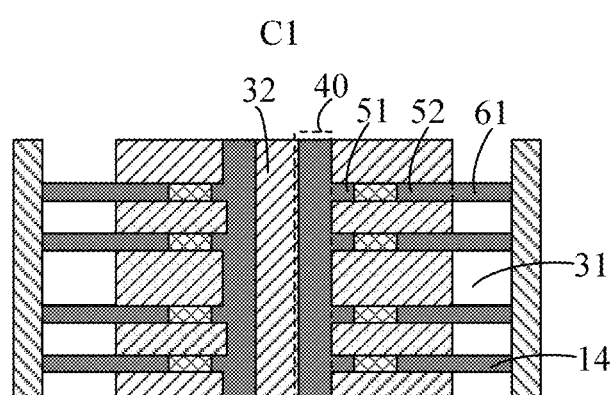
FIG. 12A is a cross-sectional view of a manufacturing method for a semiconductor device provided by an exemplary embodiment of the present application in a C1 plane parallel to a substrate after exposing a side of a third electrode.
Figure 12B:
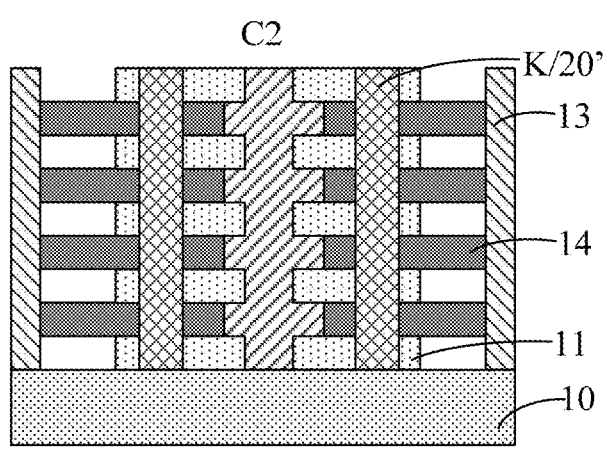
FIG. 12B is a cross-sectional view of a structure shown in FIG. 12A in a C2 plane perpendicular to a substrate.

A film layer covering an area of the conductive layer 14 for forming the third electrode 61 is etched and removed to expose a side surface of the conductive layer 14 at a set depth which is the length of the third electrode 61 as shown in FIGS. 12A and 12B. Here, FIG. 12A is a cross-sectional view in a C1 plane, and the C1 plane passes through a conductive layer 14; and FIG. 12B is a cross-sectional view in a C2 plane, and the C2 plane passes through via holes K.

Figure 13A:
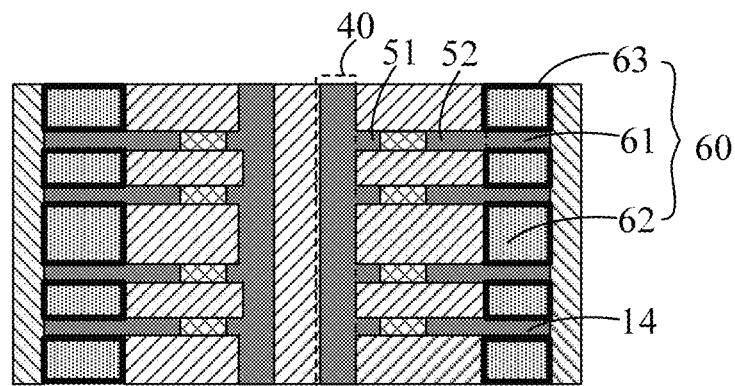
FIG. 13A is a cross-sectional view of a manufacturing method for a semiconductor device provided by an exemplary embodiment of the present application in a C1 plane parallel to a substrate after forming a capacitor.
Figure 13B:
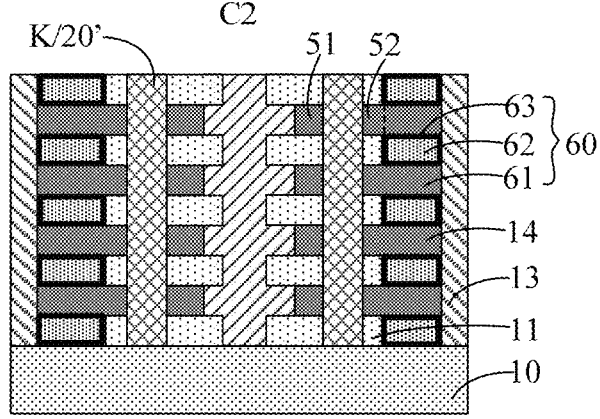
FIG. 13B is a cross-sectional view of a structure shown in FIG. 13A in a C2 plane perpendicular to a substrate.

S100: sequentially depositing a dielectric layer 63 and a fourth electrode 62 on a side surface of an exposed area (i.e., a third electrode 61) of the conductive layer 14, the third electrode 61, the fourth electrode 62 and the dielectric layer 63 constituting a capacitor, as shown in FIGS. 13A and 13B. Here, FIG. 13A is a cross-sectional view in a C1 plane, and the C1 plane passes through a conductive layer 14; and FIG. 13B is a cross-sectional view in a C2 plane, and the C2 plane passes through via holes K.

Exemplarily, a material of the dielectric layer may be silicon oxide or a High-K dielectric material.

The High-K material, in some embodiments, may include an oxide of any one or more of hafnium, aluminum, lanthanum, zirconium, or the like. Exemplarily, for example, the High-K material may include but is not limited to at least one of hafnium oxide ($HfO_2$), alumina oxide ($Al_2O_3$), hafnium aluminum oxide (HfAlO), hafnium lanthanum oxide (HfLaO), zirconium oxide ($ZrO_2$) or other High-K material.

Exemplarily, a material of the fourth electrode may include but is not limited to at least one of the following: polysilicon, tungsten, titanium nitride.

Figure 14A:
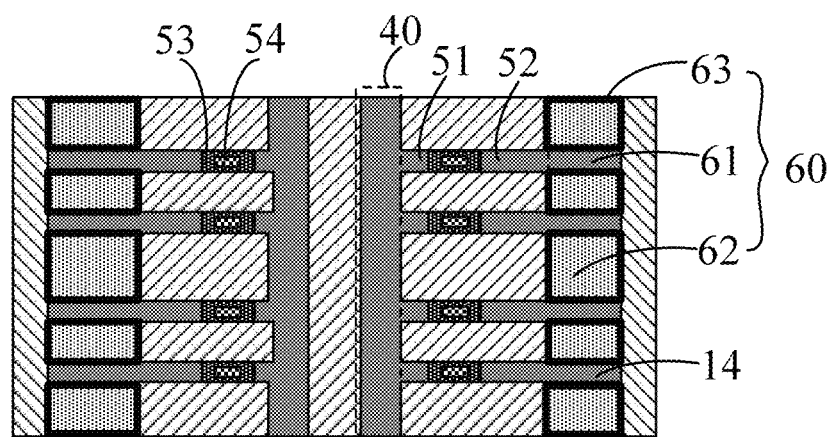
FIG. 14A is a cross-sectional view of a manufacturing method for a semiconductor device provided by an exemplary embodiment of the present application in a C1 plane parallel to a substrate after a semiconductor layer is deposited in a via hole.
Figure 14B:
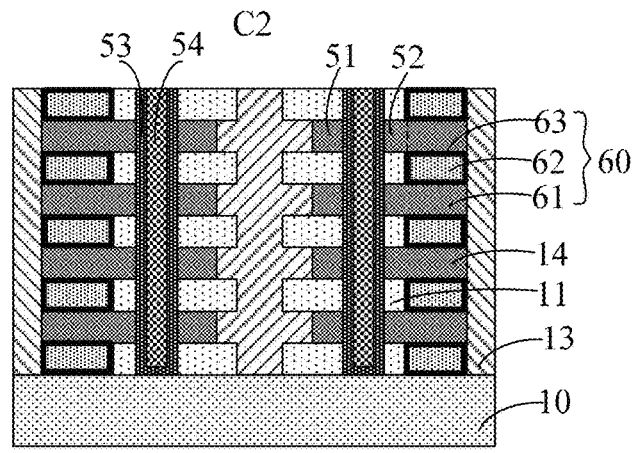
FIG. 14B is a cross-sectional view of a structure shown in FIG. 14A in a C2 plane perpendicular to a substrate.

S110: etching and removing a dummy word line 20' in a via hole K, sequentially depositing a semiconductor layer 53 and a gate insulation layer (not shown in the figure) on an inner wall of the via hole K, and depositing a gate electrode material in the via hole K to form a word line. An area of the word line located between the first electrode 51 and the second electrode 52 of the transistor serves as a gate electrode 54 of the transistor. The first electrode 51, the second electrode 52, and the semiconductor layer 53 and the gate electrode 54 located between the first electrode 51 and the second electrode 52 constitute a transistor 50, as shown in FIGS. 14A and 14B. Here, FIG. 14A is a cross-sectional view in a C1 plane, and the C1 plane passes through a conductive layer 14; FIG. 14B is a cross-sectional view in a C2 plane, and the C2 plane passes through via holes K.

Exemplarily, wet etching may be employed to remove a dummy word line such as a dummy word line formed from $Al_2O_3$.

In the present application, the semiconductor layer 53 can be understood as a semiconductor material serving as a channel of a transistor where its shape and configuration are not emphasized and only its function is emphasized.

Exemplarily, the material of the semiconductor layer may be a material such as silicon or polysilicon having a band gap less than 1.65 eV, or a wide band gap material such as a metal oxide material having a band gap greater than 1.65 eV.

For example, the material of the metal oxide semiconductor layer or channel may include a metal oxide of at least one of the following metals: indium, gallium, zinc, tin, tungsten, magnesium, zirconium, aluminum, hafnium and the like. Of course, compounds containing other elements, such as N, Si and other elements, are not excluded from the metal oxide; and it is not excluded that the metal oxide contains a small amount of other doping elements.

In some embodiments, the material of the metal oxide semiconductor layer or channel may include any one or more of indium gallium zinc oxide (InGaZnO), indium zinc oxide (InZnO), indium gallium oxide (InGaO), induim tin oxide (InSnO), indium tin oxide (InGaSnO), indium gallium tin oxide (InGaZnSnO), indium oxide (InO), tin oxide (SnO), zinc tin oxide (ZnSnO), indium aluminum zinc gold oxide (InAlZnO), zinc oxide (ZnO), indium gallium silicon oxide (InGaSiO), indium tungsten oxide (InWO), titanium oxide (TiO), zinc nitride (ZnON), magnesium zinc oxide (MgZnO), zirconium indium zinc zinc Oxide (ZrInZnO), hafnium indium zinc oxide (HfInZnO), tin indium zinc oxide (SnInZnO), aluminum tin indium zinc oxide (AlSnInZnO), silicon indium zinc oxide (SiInZnO), aluminum zinc tin oxide (AlZnSnO), gallium zinc tin oxide (GaZnSnO), zirconium zinc tin oxide (ZrZnSnO) and other materials, as long as the leakage current of the transistor can meet the requirements. It can be adjusted according to the actual situation.

These materials have a wide band gap and low leakage current. For example, when the metal oxide material is IGZO, the leakage current of the transistor does not exceed 10-15A, thereby improving a working performance of a dynamic memory.

The material of the metal oxide semiconductor layer or channel only emphasizes the element type of the material, and does not emphasize the atomic proportion in the material and the film quality of the material.

Exemplarily, the electrode material of the gate electrode may be any one or more of the following different types of materials.

For example, it is a metal containing tungsten, aluminum, titanium, copper, nickel, platinum, ruthenium, molybdenum, gold, iridium, rhodium, tantalum, cobalt and the like; or it may be a metal alloy containing these metals mentioned above.

It may also be metal oxide, metal nitride, metal silicide and metal carbide or the like, which is, for example, a metal oxide material with high conductivity such as indium tin oxide (ITO), indium zinc oxide (IZO) and indium oxide (InO); for example, it is a metal nitride material such as titanium nitride (TiN), tantalum nitride (TaN), tungsten nitride (WN) and titanium aluminum nitride (TiAlN).

Alternatively, it may also be a polysilicon material; or it may also be a semiconductor material doped with a conductive material, such as silicon doped with conductive material, germanium doped with conductive material, silicon germanium doped with conductive material, or the like, or it may be another material that embodies conductivity.

Exemplarily, a material of the gate insulation layer may include one or more layers of Low-K and/or High-K dielectric material, or two or more areas of different dielectric constants K. The characteristics of the gate insulation layer of the present application will be illustrated exemplarily below.

An example of Low-K material is silicon oxide.

An example of a High-K material is a dielectric material with a dielectric constant of K≥3.9. In some embodiments, one or more oxides of hafnium, aluminum, lanthanum, zirconium and the like may be included. Exemplarily, for example, at least one of the followings may be included but is not limited to hafnium oxide ($HfO_2$), alumina oxide ($Al_2O_3$), hafnium aluminum oxide (HfAlO), hafnium lanthanum oxide (HfLaO), zirconium oxide ($ZrO_2$) or other High-K materials.

Exemplarily, a material of the semiconductor layer 53 is IGZO, and the semiconductor layer 53, the gate insulation layer and the gate electrode 54 may be deposited using an ALD process.

S120: removing a semiconductor layer 53 of a parasitic MOS area 200.

Since the semiconductor layer 53 is connected between two transistors stacked in a direction perpendicular to the substrate 10, a parasitic MOS transistor (parasitic MOS) may be formed and the performance of the semiconductor device is affected. Therefore, a semiconductor layer 53 located in the parasitic MOS area 200 is removed and only a semiconductor layer 53 located in the channel area 300 is retained.

Figure 15A:
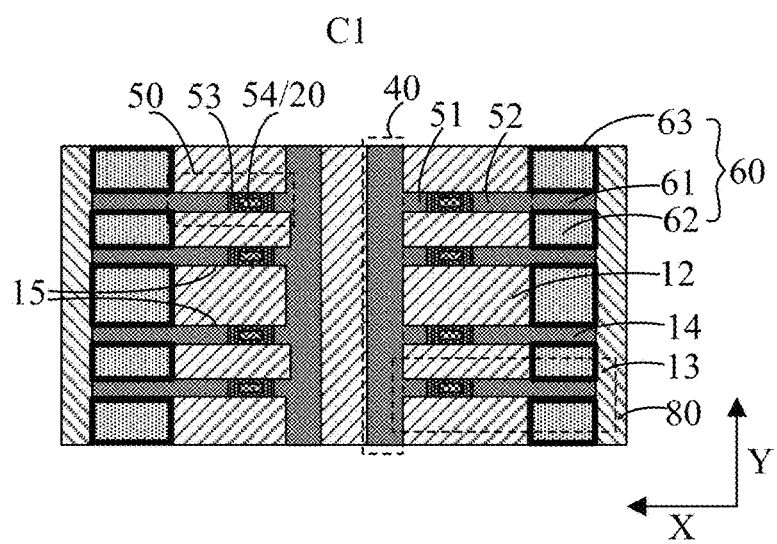
FIG. 15A is a cross-sectional view of a manufacturing method for a semiconductor device provided by an exemplary embodiment of the present application in a C1 plane parallel to a substrate after removing a semiconductor layer of a parasitic MOS area.
Figure 15B:
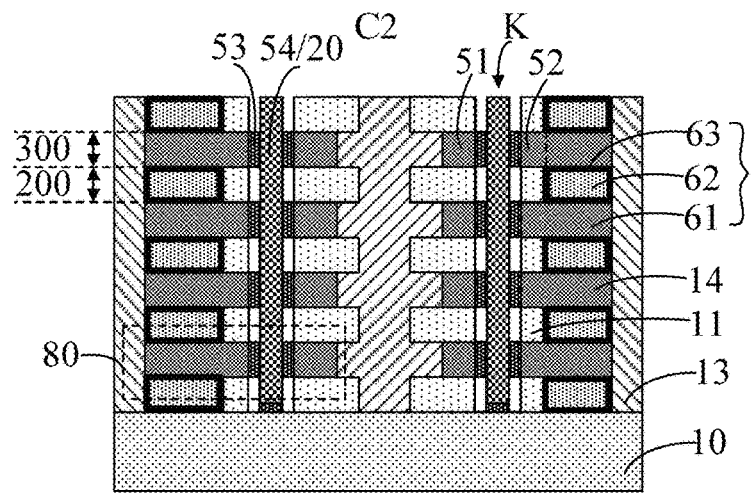
FIG. 15B is a cross-sectional view of a structure shown in FIG. 15A in a C2 plane perpendicular to a substrate.
Figure 15C:
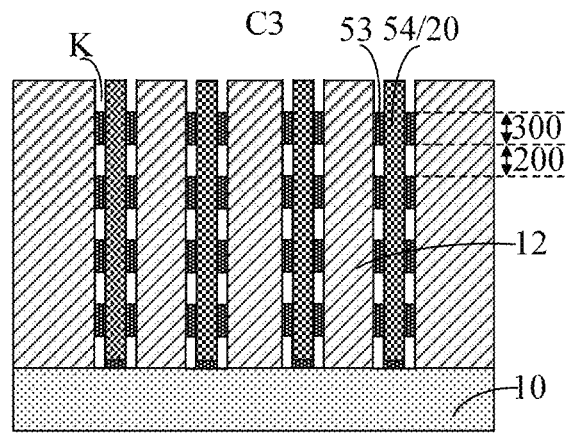
FIG. 15C is a cross-sectional view of a structure shown in FIG. 15A in a C3 plane perpendicular to a substrate.
Figure 15D:
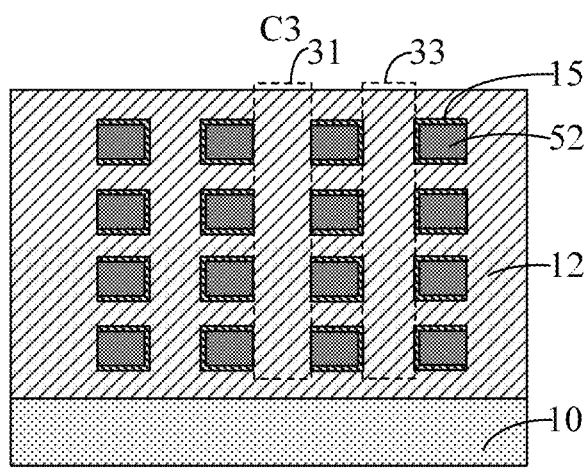
FIG. 15D is a cross-sectional view of a structure shown in FIG. 15A in another C3 plane perpendicular to a substrate.

Exemplarily, the step S120 may include:

S121: etching and removing an insulation material in a first trench 31 and a third trench 33 to expose a side wall of a sacrificial layer 11 of a memory cell 43. For example, dry etching can be used to remove the insulation material;

S122: etching and removing all sacrificial layers 11 to expose the semiconductor layer 53 previously covered by the sacrificial layer 11, that is, the semiconductor layer 53 located in the parasitic MOS area 200, for example, wet etching or dry etching being able to be used to remove all sacrificial layers 11;

S123: etching and removing the semiconductor layer 53 located in the parasitic MOS area 200, and retaining the semiconductor layer 53 located between the first electrode 51 and the second electrode 52 of the transistor, that is, the semiconductor layer 53 located in the channel area 300, the semiconductor layer 53 located in the channel area 300, the first electrode 51, the second electrode 52, and the gate electrode 54 located between the first electrode 51 and the second electrode 52 constituting a transistor 50, and the transistor 50 and a capacitor 60 connected thereto constituting a memory cell 80;

S124: depositing an insulation material filling each gap between memory cells 80 on the substrate 10, and then planarizing the insulation material on a surface of the substrate 10 using a CMP process, as shown in FIGS. 15A to 15E. Here, FIG. 15A is a cross-sectional view in a C1 plane, and the C1 plane passes through a conductive layer 14; FIG. 15B is a cross-sectional view in a C2 plane, and the C2 plane passes through via holes K; FIGS. 15C and 15D are cross-sectional views in a C3 plane, and the C3 plane in FIG. 15C passes through via holes K, and the C3 plane in FIG. 15D passes through a second electrode.

Exemplarily, the insulation material employed in step S124 may be a low-K material such as silicon oxide or other material or air (i.e. forming an air gap) which may reduce parasitic capacitance between two adjacent transistors distributed in the first direction.

An embodiment of the present application also provides a semiconductor device, which can be obtained by the manufacturing method for the semiconductor device as provided in the above embodiment of the present application.

Exemplarily, the semiconductor device includes a plurality of memory cells 80 distributed in different layers stacked along a direction perpendicular to the substrate 10 and periodically distributed. As shown in FIGS. 15A and 15B, each layer includes a plurality of columns of memory cells 80 which include transistors 50; a stacked structure including sacrificial layers 11 and conductive layers 14 alternately stacked on a substrate 10; the stacked structure includes a plurality of via holes K penetrating through the stacked structure and distributed at intervals in a first direction and a second direction, and each of which is provided with a word line 20 and a semiconductor layer 53 surrounding the word line 20. As shown in FIGS. 10A and 11A, in a column of the via holes K distributed at intervals in the first direction (Y direction), there is a first trench 31 penetrating through the stacked structure and extending in the second direction every two via holes K apart, and a third trench 33 extending in the second direction is provided between every two adjacent first trenches 31; and a bit line region 40 located at one end of each of the first trenches 31 and extending in the first direction. As shown in FIGS. 11A and 5A, the stacked structure further includes a second trench 32 extending in the first direction and separating two adjacent bit line regions 41.

As shown in FIG. 15B, the transistor 50 includes a first electrode 51, a second electrode 52, a gate electrode 54, a semiconductor layer 53 surrounding a side wall of the gate electrode 54, and a gate insulation layer disposed between the side wall of the gate electrode 54 and the semiconductor layer 53, the semiconductor layer 53 connecting the first electrode 51 and the second electrode 52. The gate electrode 54 extends in a direction perpendicular to the substrate 10.

Figure 15E:
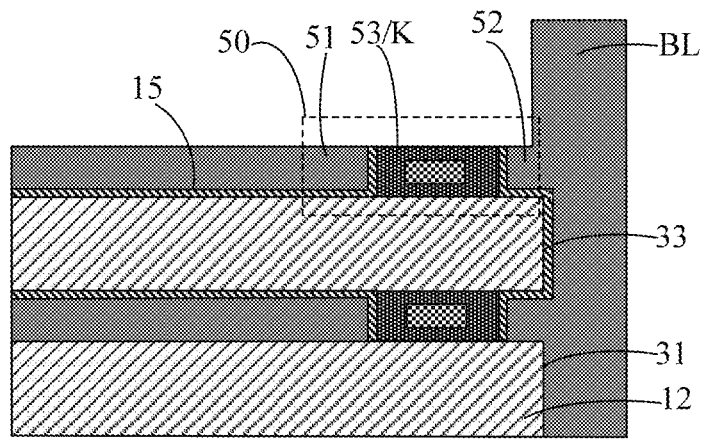
FIG. 15E is an enlarged partial view of FIG. 15A.

Exemplarily, as illustrated in FIG. 15E, the first electrode 51 or the second electrode 52 extends in the second direction, and has two end faces in the extending direction and four side walls between the two end faces. The opposite two side walls are parallel to the substrate and the other opposite two side walls are perpendicular to the substrate.

Only three of the four side walls are wrapped with an adhesion barrier layer 15.

The first electrode 51 and the second electrode 52 are wrapped with an adhesion barrier layer 15 only on end faces thereof close to the word line 20, on side walls thereof perpendicular to the substrate 10 and close to the third trench 33 and on two side walls thereof parallel to the substrate 10.

It can be understood that, as in FIG. 15D, a longitudinal section of the adhesion barrier layer 15 in the first direction (Y direction) is U-shaped. An opening of the U-shaped faces the first trench 31 and faces away from the third trench 33.

An insulation layer 12 with an opening of the U-shaped adhesion barrier layer 15 extending into the first trench 31 is in contact with the insulation layer 12. The bottom of the U-shaped adhesion barrier layer 15 is in contact with the insulation layer 12 in the third trench 33.

Exemplarily, as shown in FIG. 15E, an end face of the first electrode 51 or an end face of the second electrode 52 close to a via hole K is wrapped with an adhesion barrier layer 15.

Exemplarily, as shown in FIG. 15E, only two faces of the via hole K are surrounded by an adhesion barrier layer 15.

Exemplarily, as illustrated in FIG. 15A, two transistors 50 located in the same layer and adjacent in the first direction are separated by an insulation layer 12 in a third trench, and at least part of the transistors 50 has an adhesion barrier layer 15 on a side thereof in contact with the insulation layer 12.

Exemplarily, a side of a first electrode and a side of a second electrode of the transistor in contact with the via hole may have an adhesion barrier layer.

Exemplarily, as shown in FIG. 15B, the first electrode 51 and the second electrode 52 may be arranged in the same layer. For example, the first electrode 51 and the second electrode 52 may be located in the same conductive layer 14, and the first electrode 51 and the second electrode 52 may be formed in different areas of the same conductive layer 14, respectively.

Exemplarily, as shown in FIGS. 15A and 15B, a first electrode 51 and a second electrode 52 may both extend in a second direction, which may be parallel to the substrate 10, for example, may be an X direction as shown in FIG. 15A.

Exemplarily, a channel between the first electrode and the second electrode of one of the transistors may be a horizontal channel.

Horizontal channel means that a transport direction of carriers in the channel is in a plane parallel to the substrate, but it is not limited that the transport direction of the carriers must be one direction. In practical applications, the transport direction of the carriers extends in one direction as a whole, but locally, it is related to a shape of the semiconductor layer. In other words, the horizontal channel does not mean that it must extend along one direction in the horizontal plane, but may extend along different directions. For example, when the semiconductor layer is annular, the source contact region and the drain contact region on the annular semiconductor layer are a portion of the annulus, and in this case, carriers extend along one direction from the source contact region to the drain contact region as a whole, but may not be in one direction locally. Of course, the transport direction of the carriers in a plane parallel to the substrate is also a macroscopic concept, and is not limited to being absolutely parallel to the substrate. The present application protects the channel between the first electrode and the second electrode as a channel not perpendicular to the substrate.

Exemplarily, a plurality of semiconductor layers 53 of a plurality of transistors stacked in a direction perpendicular to the substrate 10 are disposed at intervals.

The semiconductor layer of transistors in at least part of adjacent layers of the semiconductor device provided by an embodiment of the present application are disposed at intervals, which can reduce or eliminate parasitic MOS between at least part of the layers and improve the stability of the device.

Exemplarily, semiconductor layers of the transistors of different layers are disposed at intervals in a direction perpendicular to the substrate, i.e., the semiconductor layers of the transistors of all adjacent layers are disposed at intervals in a direction perpendicular to the substrate, so that parasitic MOS between all adjacent layers can be eliminated and device stability can be improved.

Exemplarily, transistors of different layers may share a ring-shaped gate insulation layer extending in a direction perpendicular to the substrate.

Exemplarily, gate insulation layers of transistors of at least part of adjacent layers may be disposed at intervals in a direction perpendicular to the substrate.

Exemplarily, gate insulation layers of transistors of different layers are disposed at intervals in a direction perpendicular to the substrate.

Exemplarily, as illustrated in FIGS. 15A and 15B, the semiconductor device may also include a word line 20 connected to a gate electrode 54 of the transistor. Alternatively, the gate electrodes 54 may be a part of the word line 20 and the gate electrodes 54 of transistors located in different layers and disposed and stacked in a direction perpendicular to the substrate 10 may be connected together to form the word line 20.

Exemplarily, the word lines 20 may extend in a direction perpendicular to the substrate 10 and penetrate through memory cells located in different layers.

Exemplarily, material compositions of the different areas of the word line extending in a direction perpendicular to the substrate may be identical, which may be understood as being formed using the same film layer fabrication process, and the material compositions being identical may be understood as major elements tested in the material being identical, for example, all formed by conductive materials such as metals, metal nitrides or metal oxides. For example, all are made of TI, TiN, W, ITO, IZO and other conductive materials.

Exemplarily, the semiconductor layer may extend on a side wall of the gate electrode to form a ring-shaped semiconductor layer extending in a direction perpendicular to the substrate, including that the semiconductor layer extends only in a direction perpendicular to the substrate, or that the semiconductor layer extends in a direction perpendicular to the substrate on the main body, and a horizontal portion extending in a transverse direction and facing the gate electrode may exist at an end.

Here, surrounding can be understood as partially surrounding or fully surrounding. In some embodiments, as shown in FIGS. 15A to 15C, the surrounding may be fully surrounding, i.e. at least the entire side wall of the gate electrode 54 is surrounded by the semiconductor layer 53, and a cross section of the semiconductor layer 53 after surrounding is a closed ring. The cross section is a horizontal plane parallel to the substrate. In some embodiments, the surrounding may be a partial surrounding i.e. a partial side wall of the gate electrode 54 is surrounded by the semiconductor layer 53 and the cross-section after the surrounding is not closed but assumes a ring shape. For example, there is a ring with an opening or two independent semiconductor layers. For example, opposite side surfaces of the gate electrode 54 are surrounded by a semiconductor layer 53 which in this case has a cross section of a ring having two openings.

Exemplarily, as illustrated in FIG. 15A, the semiconductor device may also include a bit line 40 which may extend in a first direction. The first direction may be parallel to the substrate 10, for example, may be the Y direction shown in FIG. 15. The first direction crosses the second direction, for example, the first direction and the second direction may be perpendicular to each other.

Exemplarily, as shown in FIG. 15A, first electrodes 51 of a plurality of transistors located in the same layer and distributed at intervals in the first direction are connected to the same bit line 40.

Exemplarily, first electrodes 51 and a bit line 40 of a column of transistors located in the same layer may be an integral structure, or the first electrodes 51 and the bit line 40 may be shared.

Exemplarily, fourth electrodes of capacitors of a column of memory cells distributed in a direction perpendicular to the substrate may be an integrated structure.

Exemplarily, fourth electrodes of capacitors of a column of memory cells located in the same layer and distributed in the first direction may be an integrated structure.

The above storage cell may be a storage cell containing a transistor, the transistor may be an access transistor, and the storage cell may also include other elements, such as a capacitor in a 1T1C storage cell, or include a read transistor and a memory node in a 2T0C storage cell.

Exemplarily, the semiconductor device may be a 3D memory such as a 3D DRAM or the like. The 3D memory can be of 1T1C, 2T1C structure, and can also be of 1T0C or 2T0C (including read transistor and write transistor) structure.

An embodiment of the present application also provides an electronic equipment including the semiconductor device as provided in the above embodiment of the present application.

Exemplarily, the electronic equipment may be a storage device, a smart phone, a computer, a tablet, an artificial intelligence device, a wearable device, or a mobile power supply, or the like. The storage device may include a memory in a computer or the like, which is not limited here.

Although implementations disclosed in the present application are as described above, the described contents are only implementations used for facilitating understanding of the present application, but are not intended to limit the present application. Without departing from the spirit and scope disclosed in the present application, any person skilled in the art to which the present application belongs may make any modifications and changes in the implementation form and details, however the protection scope of the present application shall still be defined by the appended claims.

What is claimed is:

1. A manufacturing method for a semiconductor device comprising memory cells of different layers stacked and distributed in a direction perpendicular to a substrate, each memory cell comprising a transistor, the manufacturing method comprising:
   sequentially and alternately depositing sacrificial layers and insulation layers on the substrate to obtain a stacked structure;
   forming in the stacked structure a plurality of via holes penetrating through the stacked structure and distributed at intervals in a first direction, and forming dummy word lines in the via holes;
   forming a first trench penetrating through the stacked structure every two via holes apart in the stacked structure, wherein the first trench extends in a second direction, and a plurality of insulation layers and a plurality of sacrificial layers alternately stacked are distributed between any two adjacent first trenches;
   forming a plurality of grooves by re-etching the plurality of insulation layers within the first trench, wherein two grooves of each insulation layer in two first trenches respectively expose partial side walls of a dummy word line;
   forming conductive layers within corresponding two grooves of each insulation layer, wherein a plurality of conductive layers corresponding to different insulation layers are insulated from each other, and a conductive layer in each groove surrounds an exposed dummy word line; and
   disconnecting the conductive layer surrounding the dummy word line in each groove in the second direction, wherein disconnected two parts are located at opposite sides of the dummy word line, and the disconnected two parts are used for forming a first electrode and a second electrode of the transistor.

2. The manufacturing method according to claim 1, further comprising: after forming dummy word lines and before forming a plurality of grooves by re-etching the plurality of insulation layers, forming a second trench extending in the first direction in the stacked structure;
   wherein the stacked structure comprises a plurality of bit line regions and a plurality of memory cell regions connected with each of the bit line regions; a bit line region extending in the first direction is comprised between the second trench and each first trench; and a memory cell region is comprised between every two adjacent first trenches;
   the bit line region and the insulation layers and the conductive layers of the memory cell regions are integrated structures respectively; and
   the via holes are located in an area of the memory cell regions close to the bit line region.

3. The manufacturing method according to claim 2, wherein the first trenches and the second trench are formed in the stacked structure by a single etching process.

4. The manufacturing method according to claim 2, wherein:
   two columns of memory cells distributed in the second direction are separated by the second trench;
   two of the bit line regions are comprised between the two columns of memory cells, and two of the bit line regions are separated by the second trench;
   each memory cell region extends in the second direction, and a plurality of memory cell regions connected with the same bit line region are distributed on the same side of the bit line region in the first direction.

5. The manufacturing method according to claim 4, wherein forming a plurality of grooves by re-etching the plurality of insulation layers within the first trench comprises:
   transversely etching each insulation layer exposed by the second trench and the first trench by a single wet etching process, until the insulation layer is in contact with only two adjacent surfaces between two adjacent dummy word lines.

6. The manufacturing method according to claim 5, wherein forming a conductive layer in each of the grooves comprises:
   depositing a conductive layer in a first trench, a second trench and a groove between each sacrificial layer and each insulation layer; and
   etching and removing the conductive layer in the first trench and the second trench.

7. The manufacturing method according to claim 6, wherein disconnecting each conductive layer surrounding the dummy word line in the second direction comprises:
   transversely etching the conductive layer exposed on a side wall of the first trench until the dummy word line is exposed on the side wall of the first trench.

8. The manufacturing method according to claim 6, wherein depositing a conductive layer in a first trench, a second trench and a groove between each sacrificial layer and each insulation layer comprises:
   sequentially depositing an adhesion barrier layer and a metal layer in the first trench, the second trench and the groove between each sacrificial layer and each insulation layer.

9. The manufacturing method according to claim 2, further comprising:
   filling the grooves, the first trench and the second trench with an insulation material forming the insulation layers; and
   etching a stacked structure between two adjacent first trenches to form a third trench extending in the second direction, each third trench separating two of the via holes.

10. A semiconductor device made by the manufacturing method according to claim 1, wherein the semiconductor device comprises: the memory cells distributed in a multilayer array stacked and distributed in a direction perpendicular to the substrate, each memory cell comprising a transistor;
   the stacked structure comprising the insulation layers and the conductive layers alternately stacked on the substrate;
   wherein the stacked structure comprises the via holes penetrating through the stacked structure and distributed at intervals in the first direction and the second direction, and each of the via holes is provided with a word line and a semiconductor layer surrounding the word line;
   in a column of the via holes distributed at intervals in the first direction, there is the first trench penetrating through the stacked structure and extending in the second direction every two via holes apart, and a third trench extending in the second direction is provided between every two adjacent first trenches;
   a bit line region located at an end of each of the first trenches and extending along the first direction; and
   a second trench extending along the first direction and separating two adjacent bit line regions.

11. The semiconductor device according to claim 10, further comprising: a first electrode and a second electrode extending in the second direction and distributed at intervals in the second direction in a conductive layer and on both sides of the word line;
   wherein the first electrode or the second electrode each comprises two end faces in an extending direction and four side walls between the two end faces, and an end face of the first electrode or an end face of the second electrode close to the via holes is wrapped with an adhesion barrier layer.

12. The semiconductor device according to claim 11, wherein among the four side walls, only a side wall perpendicular to the substrate and close to the third trench and two side walls parallel to the substrate are wrapped with the adhesion barrier layer.

13. An electronic equipment comprising the semiconductor device according to claim 10.

14. An electronic equipment comprising the semiconductor device according to claim 11.

15. An electronic equipment comprising the semiconductor device according to claim 12.

* * * * *